（12）United States Patent
Schubert et al.

(10) Patent No.: US 7,294,926 B2
(45) Date of Patent: Nov. 13, 2007

(54) CHIP COOLING SYSTEM

(75) Inventors: Peter J. Schubert, Carmel, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 166 days.

(21) Appl. No.: 11/232,499

(22) Filed: Sep. 22, 2005

(65) Prior Publication Data

US 2007/0063337 A1 Mar. 22, 2007

(51) Int. Cl.
*H01L 23/34* (2006.01)
*H05K 7/20* (2006.01)

(52) U.S. Cl. .................. 257/714; 361/689; 361/699
(58) Field of Classification Search ...................... None
See application file for complete search history.

(56) References Cited

U.S. PATENT DOCUMENTS

| 2004/0132166 | A1* | 7/2004 | Miller et al. ............. 435/286.1 |
| 2005/0032204 | A1* | 2/2005 | Rodgers et al. .......... 435/288.5 |
| 2005/0168947 | A1* | 8/2005 | Mok et al. ................... 361/698 |
| 2006/0042825 | A1* | 3/2006 | Lu et al. ...................... 174/252 |

* cited by examiner

*Primary Examiner*—Alonzo Chambliss
(74) *Attorney, Agent, or Firm*—Jimmy L. Funke

(57) ABSTRACT

A chip cooling system including a semiconductor device having a bulk region, wherein at least one fluid channel extends at least partially through the bulk region, the fluid channel having an inlet and an outlet, a fluid inlet port in fluid communication with the channel inlet, and a fluid outlet port in fluid communication with the channel outlet, and a cooling fluid flows from the fluid inlet port, through the fluid channel and to the fluid outlet port to cool the bulk region.

12 Claims, 2 Drawing Sheets

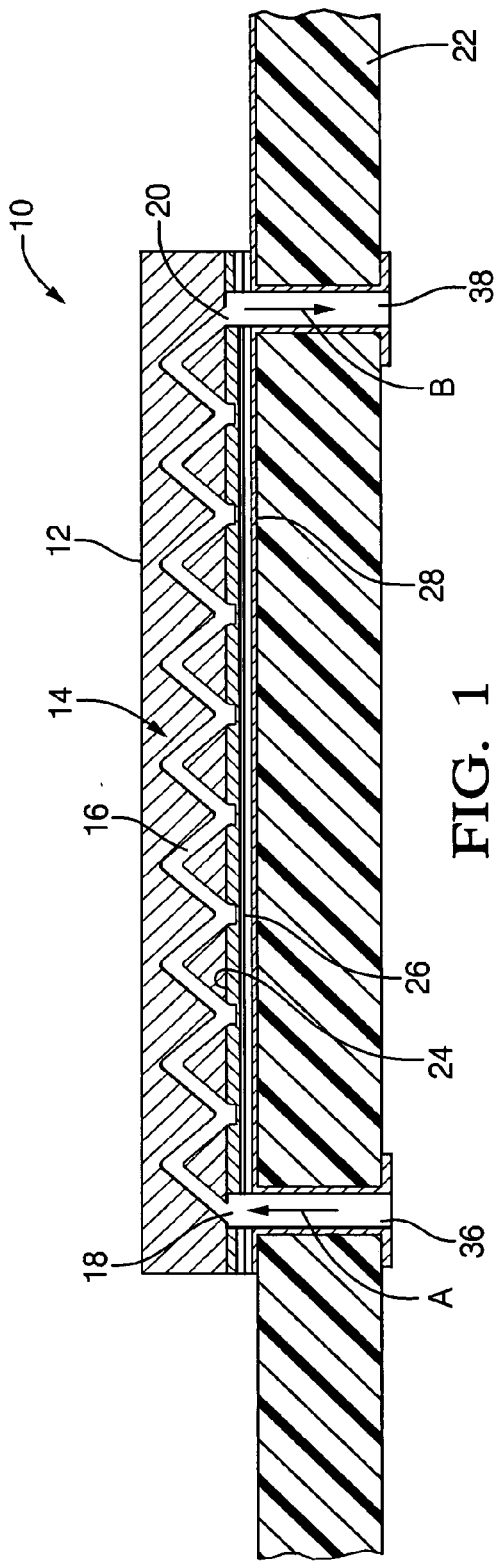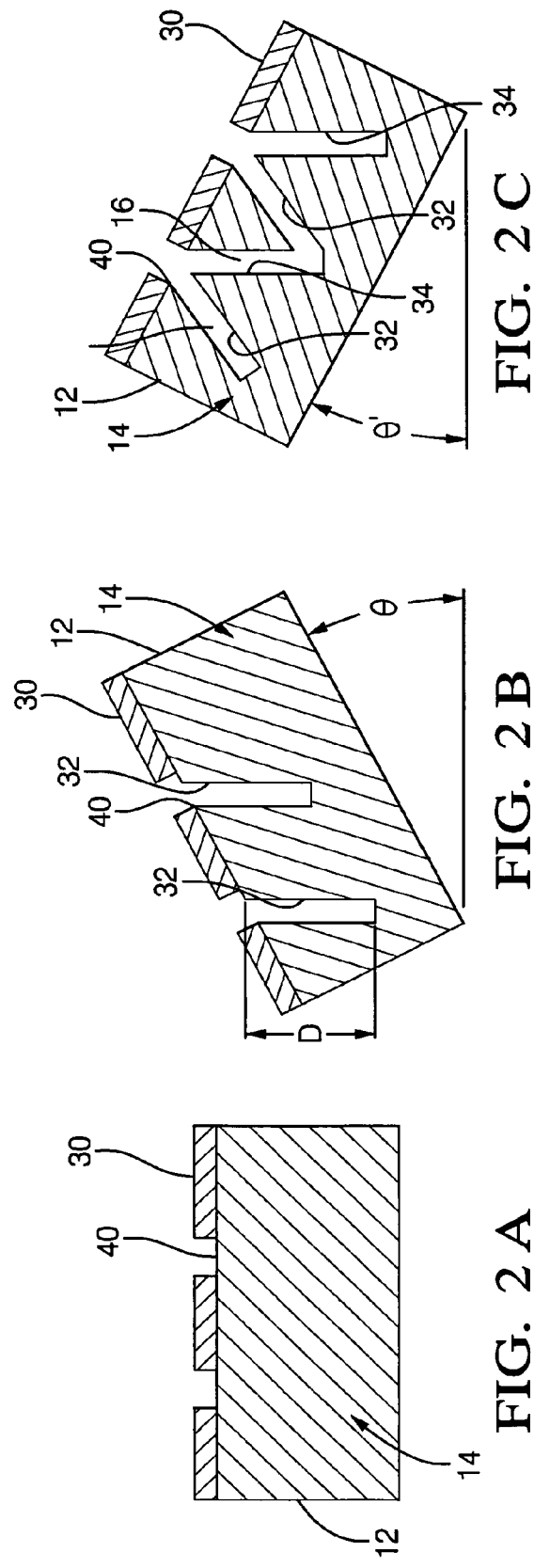

CHIP COOLING SYSTEM

BACKGROUND

The present application is directed to semiconductor chips and, more particularly, the cooling of semiconductor chips.

Semiconductor chips and other electronic devices typically increase in temperature as current flows through the chips. The increase in temperature typically is due to the inherent resistance of the semiconductor material. An excessive amount of heat may impair the performance of the devices and/or cause permanent damage.

Various techniques have been developed for cooling semiconductor chips. A passive method conducts heat away from a semiconductor chip by placing the semiconductor chip into intimate contact with a radiator material preferably having a large surface area and high thermal conductivity (e.g., aluminum, copper or diamond). Heat transferred to the radiator from the chip may be dissipated by convection (e.g., using a fan) or radiation.

Active methods for cooling semiconductor chips utilize cooling fluids such as water, alcohol, antifreeze, liquid nitrogen, gases and the like. The cooling fluid may be passed through a heat sink that is in intimate contact with the chip or substrate to be cooled. The cooling fluid, having been heated by the heat sink, may then be re-cooled using radiators, heat exchangers, refrigerators or the like.

Prior art cooling techniques have had significant shortcomings. For example, the flux area is often constrained to the area of the chip, thereby limiting the heat transfer. Furthermore, the chip-to-board bond often must carry both heat and current, which can have conflicting constraints. Furthermore, the intimacy of the bond between the chip and the heat sink is often sensitive to defects and impurities that form points of failure initiation. Furthermore, heat typically must pass through the entire bulk region of the semiconductor chip, thereby limiting heat transfer at the active regions of the device.

Accordingly, there is a need for an improved apparatus and method for dissipating heat from semiconductor chips and the like.

SUMMARY

In one aspect, the disclosed chip cooling system includes a semiconductor device having a bulk region in which at least one fluid channel extends at least partially through the bulk region, the fluid channel having an inlet and an outlet, a fluid inlet port in fluid communication with the channel inlet, and a fluid outlet port in fluid communication with the channel outlet, wherein a cooling fluid is adapted to flow from the fluid inlet port, through the fluid channel and to the fluid outlet port.

In another aspect, the disclosed chip cooling system includes a semiconductor device having a bulk region, wherein a continuous etched channel extends at least partially through the bulk region, and a cooling fluid adapted to flow through the channel.

In another aspect, a method for cooling a semiconductor chip having a bulk region is provided. The method includes the steps of etching a continuous channel into the bulk region of the chip, connecting the chip to a circuit board and passing a cooling fluid through the channel.

Other aspects of the chip cooling system will become apparent from the following description, the accompanying drawings and the appended claims.

BRIEF DESCRIPTION OF THE DRAWINGS

FIG. 1 is a side elevational view, in section, of a semiconductor chip according to one aspect of the chip cooling system;

FIG. 2A is a side elevational view, in section, of the semiconductor chip of FIG. 1 in a first stage of manufacture;

FIG. 2B is a side elevational view, in section, of the semiconductor device of FIG. 2A in a second stage of manufacture;

FIG. 2C is a side elevational view, in section, of the semiconductor device of FIG. 2B in a third stage of manufacture.

DETAILED DESCRIPTION

Figure 3:
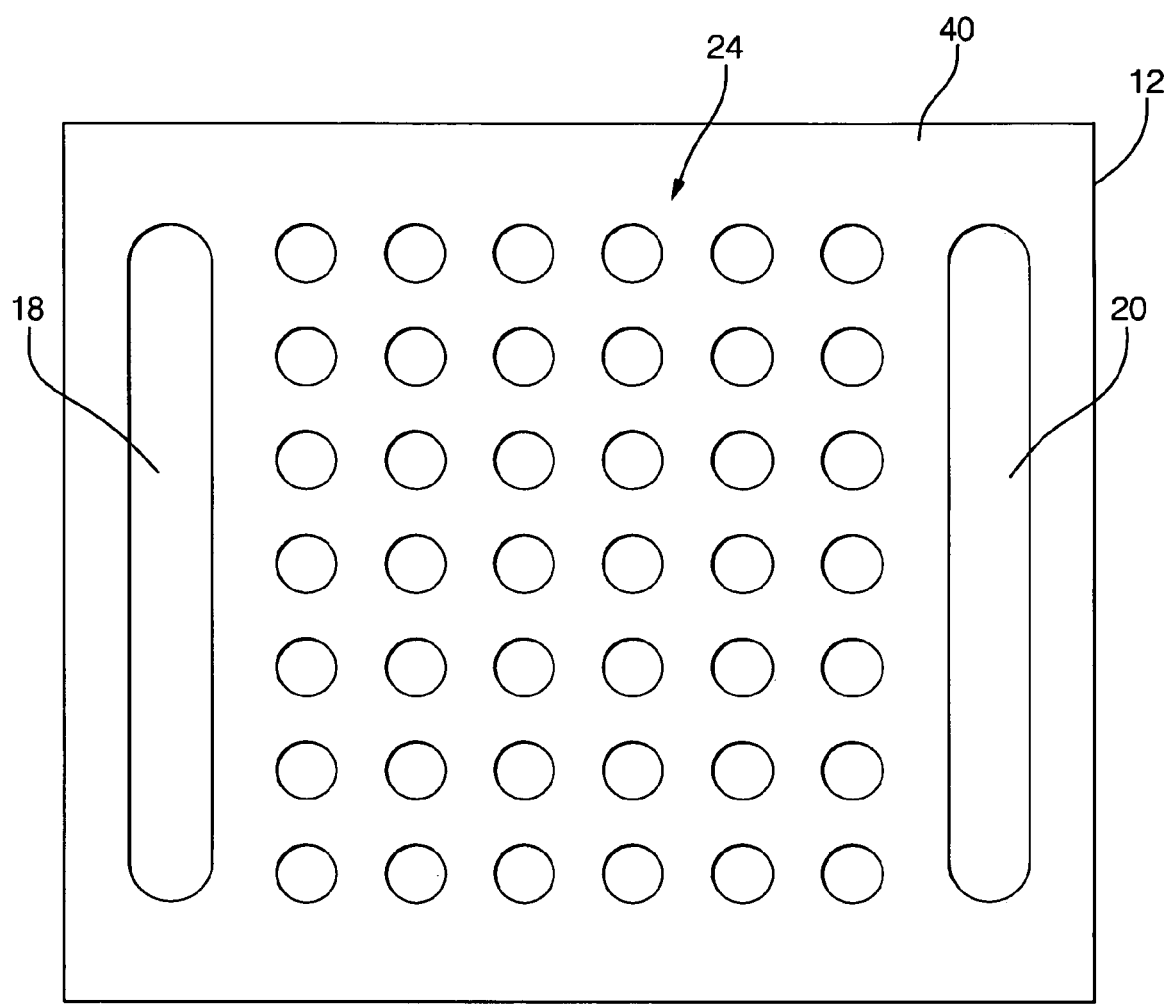
FIG. 3 is a bottom plan view of the underside of the semiconductor chip of FIG. 1.

As shown in FIG. 1, the chip cooling system, generally designated 10, may include a semiconductor wafer or chip 12 having a bulk region 14, a printed circuit board 22, a fluid inlet port 36, a fluid outlet port 38 and an electrical lead 28. An intersecting angled channel or channels 16 having an inlet manifold 18 and an outlet manifold 20 may be formed within the bulk region 14 of the chip 12 and communicate with the inlet and outlet ports 36, 38, respectively, as described in further detail below.

The chip 12 may be any semiconductor device or the like and may be formed from silicon or other like material.

As shown in FIGS. 1 and 3, an inter-metallic layer 24 may be applied to the bottom surface 40 (i.e., the surface mating with the circuit board 22) of the chip 12. The inter-metallic layer may provide improved thermal and electrical conduction and may serve a masking function, as discussed in greater detail below. The inter-metallic layer 24 may include gold, aluminum, copper, silicon or other metals and mixtures thereof and may be applied using vapor deposition or sputtering techniques or the like.

As shown in FIG. 1, the chip 12 may be bonded to the circuit board 22 by a layer of solder 26. In particular, the chip 12 may be bonded to the circuit board 22 such that the inlet manifold 18 is in fluid communication with the fluid inlet port 36 and the outlet manifold 20 is in fluid communication with the fluid outlet port 38, thereby allowing a cooling fluid to flow into the inlet manifold 18, as shown by arrow A, through the channels 16, and out of the outlet manifold 20, as shown by arrow B.

Referring to FIGS. 2A, 2B and 2C, the intersecting angled channels 16 may be formed using a two-step process. In one aspect, a deep reactive ion etch (DRIE) process (or other plasma-type etching process) may be used. Alternatively, any process capable of forming a relatively straight recess or bore to a predetermined depth may be used (e.g., machining and/or anisotropic etches).

Prior to etching the channels 16, the bottom surface 40 of the chip 12 may be coated with a mask 30, as shown in FIG. 2A. In one aspect, the mask 30 may be an insulator such as a photoresist or silicon dioxide, or it may be a metal which was first blanket deposited and then patterned with a metal etch following a photolithography step. The mask 30 may be removed or patterned at various locations on the bottom surface 40 of the chip 12 where the etching is to take place, as shown with circles (i.e., the visible portion of the channels 16) in FIG. 3. In one aspect, a plurality of etching sites may be spaced across the bottom surface 40 of the chip 12. The etching sites may be equally spaced in an array along the bottom surface 40.

As shown in FIG. 2B, the chip 12 may be tilted to a first angle Θ by, for example, using an adjustable chuck (not shown). In one aspect, angle Θ may be about 5 to about 45 degrees. In another aspect, the angle Θ may be about 10 to about 15 degrees. Once the desired angle Θ is achieved, the etching process may be initiated and the first bores 32 may be formed within the bulk region 14 of the chip 12 at each of the predetermined etch sites. The first bores 32 may be generally straight and may extend to a predetermined depth D in the bulk region 14 of the chip 12. In one aspect, the depth D may be about 10 to about 10,000 μm. In another aspect, the depth D may be about 50 μm to about 250 μm.

As shown in FIG. 2C, the second step of the process may include tilting the chip 12 to a second angle Θ' and reinitiating the etching process to form the second bores 34, which may intersect with the first bores 32. In one aspect, the second angle Θ' may be generally equal and opposite the first angle Θ. Therefore, when the chip 12 is secured to the circuit board 22 with solder 26, the solder 26 may form an electrically conductive seal between the chip 12, the lead 28 and/or the board 22 and the first and second bores 32, 34 may form continuous (e.g., zig-zag shaped) channels 16 extending from the inlet manifold 18 to the outlet manifold 20, as shown in FIG. 1.

At this point, those skilled in the art should appreciate that the channels 16 may be formed using any known techniques capable of forming fluid channels within the bulk region 14 of the chip 12. For example, the two-step process discussed above may be substituted with a one-step process, a three-step process, a four-step process or the like. Furthermore, the channels 16 may be generally two-dimensional, as shown in FIGS. 1 and 2C or, alternatively, one-dimensional or three-dimensional.

Once the etching process is complete, the mask 30 may be removed from the bottom surface 40 of the chip 12. Alternatively, the mask 30 (e.g., a metal mask) may be left on the chip 12 to facilitate electrical conduction when the chip 12 is attached to the circuit board 22.

The inlet and outlet manifolds 18, 20 may be formed by the same etching process that formed the channels 16, a separate etching process or by any other known process, such as machining. The manifolds 18, 20 may provide access to (and exit from) each of the channels 16 by way of a single opening. Therefore, cooling fluid may be urged through each of the channels 16 by introducing the cooling fluid to the inlet manifold 18. However, those skilled in the art will appreciate that cooling fluid may be introduced directly to each individual channel 16, thereby eliminating the need for an inlet manifold 18 and/or an outlet manifold 20. Alternatively, a larger number of smaller in-flow and out-flow ports may be substituted for the manifolds 18, 20, thereby reducing the amount of area lost to ports and reducing the risk of debilitating obstruction by debris.

As the cooling fluid travels through the channels 16, it moves through the bulk region 14 of the chip 12, thereby allowing the entire internal surface area of the channels 16 to facilitate heat transfer from the chip 12 to the cooling fluid. Those skilled in the art will appreciate that appropriate selection of overall channel 16 geometry, the bore 32, 34 diameter and/or the angles Θ and Θ' may allow for maximization of surface area and therefore improved heat transfer. In one aspect, the effective surface area for heat transfer created by channels 16 is in excess of five times the overall chip area.

In another aspect, the chip 12 may include additional bores (not shown) in the top and sides of the chip 12, thereby increasing contact with the cooling fluid.

EXAMPLE

A V-shaped channel 16 may be formed in the bulk region 14 of a silicon wafer 12 using a DRIE process as described below. The DRIE process has the following parameters: the minimum feature size is 4 μm, the pitch is 10 μm, the etch depth is 100 μm and the etch angle is 10 degrees. The hole-to-hole distance is 35 μm for a single zig of a zig-zag pattern.

Spacing the holes laterally by 10 μm gives an effective area of 350 μm$^2$ per zig. By simple geometry of the interior surface of the two intersecting channels, the internal surface is 2513 μm$^2$ per zig, giving an area leverage of 7.2:1. Thus, for a representative chip having an area of 1 cm$^2$, and reserving 20% of the area for outer perimeter bonding and for through-hole ports, the effective cooling area of the chip has been increased by 5.75 times.

Those skilled in the art will appreciate that these estimates err on the conservative size. Greater benefits may be achievable. There will be practical limits to the area leverage in the case of through-chip current conduction, since in the limit of small DRIE feature size and pitch, the flux area available for current flow will decrease. For surface conduction chips, the full advantage may be realized by minimizing DRIE feature size and pitch.

Accordingly, by cooling semiconductor chips 12 according to the chip cooling system 10 described and claimed herein, the following non-limiting improvements and/or advantages may be obtained: (1) the effective surface area for heat transfer may be increased, (2) the chip to carrier bond may only conduct current, (3) the bond area may be kept cooler to reduce the rate of failure initiation, and (4) the distance between active device regions (i.e., hot spots within the chip 12) and the cooling fluid may be reduced.

Although the chip cooling system is shown and described with respect to certain aspects, modifications may occur to those skilled in the art upon reading the specification. The chip cooling system includes all such modifications and is limited only by the scope of the claims.

What is claimed is:

1. A chip cooling system comprising:
   a semiconductor device having a bulk region, said bulk region having at least one fluid channel said fluid channel including a plurality of angled and interconnecting bores forming a zig-zag pattern extending at least partially therethrough, said fluid channel having an inlet and an outlet;
   a fluid inlet port in fluid communication with said channel inlet; and
   a fluid outlet port in fluid communication with said channel outlet;
   wherein said fluid inlet port, inlet, channel, outlet and outlet port allow a cooling fluid to flow through and cool said bulk region.

2. The chip cooling system of claim 1 wherein said semiconductor device is a silicon wafer.

3. The chip cooling system of claim 1 further comprising a circuit board, wherein said semiconductor device is connected to said circuit board.

4. The chip cooling system of claim 3 wherein said semiconductor device is connected to said circuit board with solder.

5. The chip cooling system of claim 3 wherein said fluid inlet port and said fluid outlet port extend through said circuit board.

6. The chip cooling system of claim 1 wherein said fluid channel is etched into said bulk region of said semiconductor device.

7. The chip cooling system of claim 6 wherein fluid channel is etched using a deep reactive ion etching process.

8. A chip cooling system comprising:
a semiconductor device having a bulk region, wherein a continuous etched channel having zip-zag shape and extends at least partially through said bulk region; and
a cooling fluid contained in said channel.

9. The chip cooling system of claim 8, wherein said semiconductor device is a silicon wafer.

10. The chip cooling system of claim 8, further comprising a circuit board, wherein said semiconductor device is soldered to said circuit board.

11. The chip cooling system of claim 8, further comprising a fluid inlet port and a fluid outlet port in fluid communication with said channel.

12. The chip cooling system of claim 8, wherein channel is formed using a deep reactive ion etching process.

* * * * *